United States Patent
Andreasson et al.

(10) Patent No.: US 9,249,288 B2
(45) Date of Patent: Feb. 2, 2016

(54) FLAME RETARDANT POLYMER COMPOSITION

(71) Applicant: BOREALIS AG, Wien (AT)

(72) Inventors: Urban Andreasson, Odsmal (SE); Takashi Uematsu, Stenungsund (SE); Bernt-Ake Sultan, Stenungsund (SE); Martin Anker, Hisings Karra (SE); Oscar Prieto, Gothenburg (SE)

(73) Assignee: BOREALIS AG, Wien (AT)

( * ) Notice: Subject to any disclaimer, the term of this patent is extended or adjusted under 35 U.S.C. 154(b) by 0 days.

(21) Appl. No.: 14/397,168

(22) PCT Filed: Apr. 29, 2013

(86) PCT No.: PCT/EP2013/001278
§ 371 (c)(1),
(2) Date: Oct. 24, 2014

(87) PCT Pub. No.: WO2013/159942
PCT Pub. Date: Oct. 31, 2013

(65) Prior Publication Data
US 2015/0112007 A1    Apr. 23, 2015

(30) Foreign Application Priority Data

Apr. 27, 2012  (EP) .................................. 12002996

(51) Int. Cl.
| | | |
|---|---|---|
| *A61K 9/70* | (2006.01) | |
| *H02G 15/00* | (2006.01) | |
| *C08L 23/08* | (2006.01) | |
| *H01B 7/295* | (2006.01) | |
| *H01L 31/048* | (2014.01) | |

(52) U.S. Cl.
CPC ......... *C08L 23/0892* (2013.01); *C08L 23/0846* (2013.01); *H01B 7/295* (2013.01); *H01L 31/0481* (2013.01); *C08L 2201/02* (2013.01); *C08L 2203/202* (2013.01); *C08L 2310/00* (2013.01)

(58) Field of Classification Search
CPC ............ C08L 23/0892; C08L 2201/02; C08L 2203/202; C08L 2310/00; H01L 31/0481
USPC ........................................................ 524/266
See application file for complete search history.

(56) References Cited

U.S. PATENT DOCUMENTS

| | | | |
|---|---|---|---|
| 4,297,310 A | 10/1981 | Akutsu et al. | |
| 4,351,876 A | 9/1982 | Doi et al. | |
| 4,397,981 A | 8/1983 | Doi et al. | |
| 4,413,066 A | 11/1983 | Isaka et al. | |
| 4,446,283 A | 5/1984 | Doi et al. | |
| 4,456,704 A | 6/1984 | Fukumura et al. | |
| 8,546,692 B2* | 10/2013 | Torgersen et al. | 174/110 R |
| 2008/0188589 A1* | 8/2008 | Sultan et al. | 523/173 |
| 2011/0126887 A1* | 6/2011 | Sultan et al. | 136/251 |

FOREIGN PATENT DOCUMENTS

| | | |
|---|---|---|
| EP | 0393959 A2 | 10/1990 |
| EP | 0449939 B1 | 10/1991 |
| EP | 1512719 A1 | 3/2005 |
| EP | 1695997 A1 | 8/2006 |
| EP | 1923404 A1 | 5/2008 |
| EP | 2144301 A1 | 1/2010 |
| EP | 2562768 A1 | 2/2013 |
| WO | 2005/003199 A1 | 1/2005 |
| WO | 2011160964 A1 | 12/2011 |

OTHER PUBLICATIONS

Abstract of CN101798416, Aug. 11, 2010.*
International Preliminary Report on Patentability of International Application No. PCT/EP2013/001278 mailed Oct. 28, 2014.
International Search Report of International Application No. PCT/EP2013/001278 mailed Feb. 19, 2014.
Haslam et al., "Identification and Analysis of Plastics", London Iliffe Books, 2nd Edition, 1972, pp. 278-332.

* cited by examiner

*Primary Examiner* — Hui Chin
(74) *Attorney, Agent, or Firm* — Roberts Mlotkowski Safran & Cole, P.C.

(57) ABSTRACT

The present invention relates to a flame retardant polymer composition comprising a crosslinkable terpolymer comprising ethylene monomer units, a silane group containing comonomer units and comonomer units comprising a polar group; a metal carbonate filler and a silicone fluid or gum; wherein the content of the comonomer units comprising a polar group is between 2 and 25 wt % of the terpolymer and the content of the silane group containing comonomer units is between 0.2 and 4 wt % of the terpolymer. The present invention is also directed to the process for the production of the polymer composition, to a cable and/or to an electrical device having a layer comprising said polymer composition, and uses thereof.

12 Claims, No Drawings

FLAME RETARDANT POLYMER COMPOSITION

The present invention relates to a flame retardant polymer composition comprising a crosslinkable terpolymer comprising ethylene monomer units, a silane group containing comonomer units and comonomer units comprising a polar group; a metal carbonate filler and a silicone fluid or gum. The present invention is also directed to the process for the production of the polymer composition, to a cable and/or to an electrical device having a layer comprising said polymer composition, and uses thereof.

A typical electrical power cable or wire generally comprises one or more conductors in a cable core, which is surrounded by one or more insulation layers or sheaths of polymeric material. The core is typically copper or aluminium but it may also be non-metallic, surrounded by a number of different polymeric layers, each serving a specific function, e.g. a semiconducting shield layer, an insulation layer, a metallic tape shield layer and a polymeric jacket. Each layer can provide more than one function. For example, low voltage wire or cable are often surrounded by a single polymeric layer that serves as both an insulating layer and an outer jacket, while medium to extra-high voltage wire and cable are often surrounded by at least separate insulating and jacket layers. A power cable core may for example be surrounded by a first polymeric semiconducting shield layer, a polymeric insulating layer, a second polymeric semiconducting shield layer, a metallic tape shield, and a polymeric jacket.

A wide variety of polymeric materials have been utilized as electrical insulating and shield materials for cables.

Such polymeric materials in addition to having suitable dielectric properties must also be enduring and must substantially retain their initial properties for effective and safe performance over many years of service.

Such materials have also to meet stringent safety requirements as laid down in international standards. In particular, single cable, or bundle of cables, must not burn by itself or transmit fire; the combustion gases of a cable must be as harmless as possible to humans, the smoke and combustion gases formed must not obscure escape routes or be corrosive.

For example, cables used in photovoltaic installations are exposed to a wide variety of atmospheric conditions, especially to ultraviolet radiation, humidity and sudden changes in temperature. For this reason, photovoltaic cables must have specific mechanical resistance properties that guarantee their operation in time in addition to satisfy the safety and security requirements.

In photovoltaic installations, the solar radiation is collected in photovoltaic cells and is transformed into current and transported through a connection to an inverter, which converts the continuous current into alternate to introduce into the network. The power developed will depend on the number of modules installed, for which the range of cables must cover all possibilities.

Flame retardants are chemicals used in polymers that inhibit or resist the spread of fire. For improving the flame retardancy of polymers compositions to be used in wires or cables, compounds containing halides were first added to the polymer. However these compounds have the disadvantage that upon burning, hazardous and corrosive gases like hydrogen halides are liberated.

Then, one approach to achieve high flame retardant properties in halogen-free polymer compositions has been to add large amounts, typically 50 to 60 wt % of inorganic fillers such as hydrated and hydroxy compounds. Such fillers, which include $Al(OH)_3$ and $Mg(OH)_2$ decomposes endothermically at temperatures between 200 and 600° C., liberating inert gases. The drawback of using large amounts of fillers is the deterioration of the processability and the mechanical properties of the polymer composition.

EP393959 discloses a flame retardant polymer composition which is substantially free of halogen compounds and of organometallic salts comprising a copolymer of ethylene with one or more comonomers selected from the group consisting of alkyl acrylates, alkyl methacrylates, acrylic acid, methacrylic acid and vinyl acetate, a silicone fluid or gum and inorganic filler. The patent also relates to the so called Borealis CaSiCo systems. Said systems, however, do not fulfill crushing resistance tests and therefore cannot be used for UL1581 horizontal utility industrial and commercial building applications. Furthermore, American standard UL44 for industrial and commercial cables and standards require that cables are crosslinked. Therefore an extra step for CaSiCo systems, namely the addition of a crosslinking agent needs to be accounted for. Still further, the dripping behavior of the CaSiCo systems is quite high; meaning that in the event of fire dripping may contribute to the catching of fire of other cables or element surrounding the cable.

It has now been found that by providing in a polymer composition comprising a silicon fluid or gum and a mineral filler, a terpolymer comprising ethylene monomer units, a silane group containing comonomer units and comonomer units comprising a polar group other than silane groups, the flame retardant properties as well as the mechanical properties of its moulded or extruded products may be improved.

In particular, in order to meet American UL44 standards for electrical wires, cables and flexible cords, critical tests such as crushing resistance and horizontal flame tests have to be fulfilled.

The polymer composition according to the present invention has the advantage of having essentially no emission of harmful gases and combining excellent flame retardant properties and very good mechanical properties.

In particular, with the composition of the present invention the crushing resistance requirements can be improved. In addition no extra step for adding a crosslinking agent is needed as the terpolymer already incorporates a crosslinking precursor. No dripping is observed when the inventive composition is crosslinked, resulting in excellent flame retardant properties.

Accordingly, it is an object of the present invention to provide a flame retardant polymer composition comprising:
(A) a crosslinkable terpolymer comprising ethylene monomer units, silane group containing comonomer units and comonomer units comprising a polar group;
(B) a metal carbonate filler;
(C) a silicone fluid or gum,
wherein the content of the comonomer units comprising a polar group is between 2 and 25 wt % of the terpolymer and the content of the silane group containing comonomer units is between 0.2 and 4 wt % of the terpolymer.

Preferably, the comonomer units comprising polar groups are selected from the groups consisting of acrylic acids, methacrylic acids, acrylates, methacrylates, and vinyl esters.

Advantageously the content of the comonomer units comprising a polar group in the terpolymer is between 2 and 20 wt %, or preferably between 4 and 10 wt % of the terpolymer.

According to an embodiment of the invention, the silane group containing comonomer units is present in an amount between 0.5 to 2.5 wt % of the terpolymer.

The terpolymer is preferably present in an amount of 30 to 85 wt % preferably in an amount of 35 to 75 wt %, more preferably between 38 to 65 wt % and even more preferably between 40 to 62 wt % of the total polymer composition.

Preferably the terpolymer has a $MFR_{2.16,\ 190°\ C.}$ between 0.1 to 30 g/10 min, preferably between 0.1 and 5 g/10 min, even more preferably between 0.5 and 2 g/10 min or between 0.5 and 1 g/10 min.

Advantageously the metal carbonate filler included in the compositions according to the present invention is between 10 to 80 wt %, preferably 25 to 65 wt %, more preferably between 30 and 50 wt % and even more preferably between 33 and 48 wt % of the total composition.

According to a preferred embodiment the metal is magnesium and/or calcium.

The silicone fluid or gum is preferably present in an amount between 0.1 to 20 wt % of the total polymer composition, more preferably between 0.1 to 10 wt %, even more preferably between 0.2 or 0.5 to 8 wt % of the total polymer composition.

Preferably the polymer composition further comprises a scorch retarder.

According to a particularly preferred embodiment the polymer composition comprises
(A) an ethylene/ethyl acrylate or butyl acrylate/vinyltrimethoxysilane terpolymer
(B) a silicon fluid or gum,
(C) calcium or magnesium carbonate,
(D) a scorch retarder;
and (A), (B), (C) and (D) together amount to at least 97 wt % of the total polymer composition.

A particularly important use of the polymer composition according to the present invention is for the manufacture of wires, cables and/or electrical devices. Cables may be communication cables or more preferably electrical or power cables. The compositions can be extruded about a wire or cable to form an insulating or jacketing layer or can be used as bedding compounds. Therefore the present invention also provides a cable having a layer comprising the polymer composition of the invention; preferably the polymer composition is then crosslinked. Electrical devices are preferably photovoltaic devices and UL44: American utility industrial and commercial building cables.

According to a preferred embodiment the cable is a low voltage cable, preferably below 1000 V.

According to a particularly preferred embodiment the cable is a photovoltaic cable and UL44: American utility industrial and commercial building cable.

Advantageously the cable fulfills the UL44 and TÜV 2Pfg 1169/08.2007 standards.

The present invention thereby pertains to a cable, preferably a photovoltaic cable, and/or to an electrical device, preferably a photovoltaic solar module having a layer comprising the polymer composition the present invention.

DETAILED DESCRIPTION

The flame retardant polymer composition according to the invention comprises a crosslinkable terpolymer comprising ethylene monomer units, a silane group containing comonomer units and comonomer units comprising a polar group other than a silane group.

With the term terpolymer is meant a polymer which comprises three different types of monomers or comonomers, preferably which consists of the three different monomers or comonomers.

According to a preferred embodiment, the comonomer units comprising polar groups are selected from the groups consisting of acrylic acids, methacrylic acids, acrylates, methacrylates, and vinyl esters.

Preferably the comonomer units comprising a polar group are selected from the group consisting of vinyl carboxylate esters, such as vinyl acetate and vinyl pivalate, (meth)acrylates, such as methyl(meth)acrylate, ethyl(meth)-acrylate, butyl(meth)acrylate and hydroxyethyl(meth)acrylate, olefinically unsaturated carboxylic acids, such as (meth)acrylic acid, maleic acid and fumaric acid, (meth)acrylic acid derivatives, such as (meth)acrylonitrile and (meth)acrylic amide, and vinyl ethers, such as vinyl methyl ether and vinyl phenyl ether.

Amongst these comonomer units, vinyl esters of monocarboxylic acids having 1 to 4 carbon atoms, such as vinyl acetate, and (meth)acrylates of alcohols having 1 to 4 carbon atoms, such as methyl(meth)acrylate, are particularly preferred. The term "(meth) acrylic acid" is intended here to embrace both acrylic acid and methacrylic acid.

Especially preferred comonomer units are butyl acrylate, ethyl acrylate and methyl acrylate. Two or more such olefinically unsaturated compounds may be used in combination.

The content of the comonomer units comprising a polar group in the terpolymer is between 2 and 25 wt %, preferably between 2 and 20 wt %, more preferably between 4 and 10 wt % of the terpolymer.

To effect cross-linking, the terpolymer further comprises silane group containing comonomer units. Preferably the silane group containing comonomer units is represented by the formula:

$$R^1SiR^2_qY_{3-q} \tag{I}$$

Wherein $R^1$ is an ethylenically unsaturated hydrocarbyl, hydrocarbyloxy or (meth)acryloxy hydrocarbyl group,
$R^2$ is an aliphatic saturated hydrocarbyl group,
Y which may be the same or different, is a hydrolysable organic group and q is 0, 1 or 2.

Examples of the silane group containing comonomer units are those wherein $R^1$ is vinyl, allyl, isopropenyl, butenyl, cyclohexanyl or gamma-(meth)acryloxy propyl; Y is methoxy, ethoxy, formyloxy, acetoxy, propionyloxy or an alkyl- or arylamino group; and $R^2$, if present, is a methyl, ethyl, propyl, decyl or phenyl group.

A preferred silane group containing comonomer unit is represented by the formula:

$$CH_2=CHSi(OA)_3$$

wherein A is a hydrocarbyl group having 1-8 carbon atoms, preferably 1-4 carbon atoms.

The most preferred silane groups containing comonomer units are vinyl trimethoxysilane, vinyl bismethoxyethoxysilane, vinyl triethoxysilane, gamma-(meth)acryl-oxypropyltrimethoxysilane, gamma(meth)acryloxypropyltriethoxysilane, and vinyl triacetoxysilane.

The silane group containing comonomer units are present in an amount between 0.2 and 4 wt % and preferably between 0.5 to 2.5 wt % of the terpolymer.

The terpolymer comprising ethylene monomer units, silane group containing comonomer units and comonomer units comprising a polar group may be produced by grafting, or, preferably, by copolymerisation of ethylene monomers and unsaturated monomers containing silane groups and polar groups.

Grafting is a chemical modification of the polymer by addition of silane groups containing compound usually in a radical reaction. Such silane groups containing comonomers and compounds are well known in the field and e.g. commercially available. The hydrolysable silane groups are typically then crosslinked by hydrolysis and subsequent condensation in the presence of a silanol condensation catalyst and H2O in a manner known in the art. Silane crosslinking techniques are known and described e.g. in U.S. Pat. No. 4,413,066, U.S. Pat. No. 4,297,310, U.S. Pat. No. 4,351,876, U.S. Pat. No. 4,397,981, U.S. Pat. No. 4,446,283 and U.S. Pat. No. 4,456,704.

Copolymerisation of ethylene monomers and unsaturated monomers containing silane groups and polar groups can be done according to EP1923404.

The terpolymer is preferably present in an amount of 30 to 85 wt % preferably in an amount of 35 to 75 wt %, more preferably between 38 to 65 wt % and even more preferably between 40 to 62 wt % of the total polymer composition.

Preferably the terpolymer has $MFR_{2.16, 190° C.}$ between 0.1 to 30 g/10 min, preferably between 0.1 and 5 g/10 min, even more preferably between 0.5 and 2 g/10 min or between 0.5 and 1 g/10 min.

Preferably the terpolymer has density ranging between 922-932 kg/m³. The density was measured according to ISO 1183-2. The sample preparation was executed according to ISO 1872-2 Table 3 Q (compression moulding).

The flame retardant polymer composition further comprises a silicon fluid or gum. Suitable silicone fluids and gums include for example organopolysiloxane polymers comprising chemically combined siloxy units. Preferably the siloxy units are selected from the group consisting of $R_3SiO_{0.5}$, $R_2SiO$, $R^1SiO_{1.5}$, $R^1R_2SiO_{0.5}$, $RR^1SiO$, $R^1_2SiO$, $RSiO_{1.5}$ and $SiO_2$ units and mixtures thereof in which each R represents independently a saturated or unsaturated monovalent hydrocarbon radical, and each $R^1$ represents a radical such as R or a radical selected from the group consisting of a hydrogen atom, hydroxyl, alkoxy, aryl, vinyl or allyl radicals.

The organopolysiloxane, preferably has a viscosity of approximately 600 to 300×10⁶ centipoise at 25° C. An example of an organopolysiloxane which has been found to be suitable is a polydimethylsiloxane having a viscosity of approximately 20×10⁶ centipoise at 25° C. The silicone fluid or gum can contain fumed silica fillers of the type commonly used to stiffen silicone rubbers e.g. up to 50% by weight.

The amount of silicone fluid or gum included in the composition according to the present invention is preferably from 0.1 to 20 wt %, preferably from 0.1 to 10 wt % even more preferably between 0.2 or 0.5 to 8 wt % of the total polymer composition.

The flame retardant polymer composition further comprises a metal carbonate filler. The metal carbonate filler is preferably a carbonate of magnesium and/or calcium. Examples of suitable metal carbonate fillers are calcium carbonate, magnesium carbonate, and huntite $2[Mg_3Ca(CO_3)_4]$. Although the filler is not a hydroxide, it can contain small amounts of a hydroxide typically less than 5% by weight of the filler, preferably less than 3% by weight. For example, there may be small amounts of magnesium hydroxide or magnesium oxide. Also, although the filler is not a substantially hydrated compound, it can contain small amounts of water, usually less than 3% by weight of the filler, preferably less than 1.0% by weight. The filler may have been surface treated with a carboxylic acid or salt to aid processing and provide better dispersion of the filler in the polymer composition. There can also be additional filler(s).

Preferably, the metal carbonate filler used in the flame retardant composition according to the present invention comprises at least 50% by weight of calcium carbonate. More preferably, it is substantially all magnesium or calcium carbonate.

The amount of metal carbonate filler included in the compositions according to the present invention is between 10 to 62 wt %, more preferably between 30 and 50 wt % and even more preferably between 33 and 48 wt % of the total composition.

The metal carbonate filler will generally have an average particle size of less than 50 micron, preferably less than 5 micron and most preferably about 1 to 2.5 microns.

The flame retardant polymer compositions may be prepared by mixing together the terpolymer, the silicone fluid or gum and the metal carbonate filler using any suitable means such as conventional compounding or blending apparatus, e.g. a Banbury mixer, a 2-roll rubber mill or a twin screw extruder. Generally, the composition is prepared by blending the above mentioned components together at a temperature which is sufficiently high to soften and plasticise the terpolymer, typically a temperature in the range 120 to 300° C.

In addition to the terpolymer, the silicone fluid or gum and the filler, the compositions according to the present invention may contain additional ingredients such as, for example, antioxidants and small amounts of other conventional polymer additives such as stabilizers e.g. water tree retardants, scorch retardants, lubricants, colouring agents and foaming agents. The total amount of additives is generally 0.3 to 10 wt. %, preferably 1 to 7 wt. %, more preferably 1 to 5 wt. %.

Preferably an antioxidant comprises a sterically hindered phenol group or aliphatic sulphur groups. Such compounds are disclosed in EP 1 254 923 as particularly suitable antioxidants for stabilisation of polyolefin containing hydrolysable silane groups. Other preferred antioxidants are disclosed in WO2005/003199. Preferably, the antioxidant is present in the composition in an amount of from 0.01 to 3 wt %, more preferably 0.05 to 2 wt %, and most preferably 0.08 to 1.5 wt %.

Preferably the polymer composition of the present invention comprises a scorch retarder. More preferably is the scorch retarder is a silane containing scorch retarder as described in EP449939.

Preferably the scorch retarder is a silane compound with at least one hydrolysable organic group. Preferably the silane compound has a compatibility with the polymer composition of at least 0.035 mole hydrolysable groups per 1000 g polymer composition. The compatibility is defined as the residual content which is determined indirectly by measuring the decrease in weight of the composition in moles of hydrolysable groups per 1000 g polymer composition and which, with an initial content of 0.060 mole hydrolysable groups per 1000 g polymer composition, after storage for 74 h at 600 C in air still has not volatilised. Preferably the silane compound is represented by the general formula:

$$R^5(SiR^6_nX_{3-n})_m \qquad (III)$$

wherein $R^5$ is a monofunctional hydrocarbyl group having 13-30 carbon atoms, or a difunctional hydrocarbyl group having 4-24 carbon atoms; $R^6$ which may be the same or different, is a hydrocarbyl group having 1-10 carbon atoms; X which may be the same or different, is a hydrolysable organic group; n is 0, 1 or 2, and m is 1 or 2.

More preferably the scorch retarder is hexadecyl trimethoxy silane (HTDMS).

The scorch retarder is preferably present in the composition in an amount between 0.3 wt % and 5 wt %.

According to a particularly preferred embodiment the polymer composition of the invention comprises an ethylene/ethyl acrylate or butyl acrylate/vinyltrimethoxysilane terpolymer, a silicon fluid or gum, calcium or magnesium carbonate, a scorch retarder and these components together amount to at least 97 wt % of the total polymer composition.

The compositions according to the present invention are crosslinkable and may therefore further comprise a crosslinking agent.

For crosslinking of polymer containing hydrolysable silane groups, a silanol condensation catalyst is preferably used. Conventionally used catalysts are, for example tin-, zinc-, lead- or cobalt-organic compounds such as dibutyl tin dilaurate (DBTDL). Preferably the silanol condensation catalyst is a dihydrocarbyl tin dicarboxylate according to the following formula (IV):

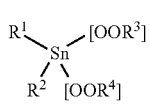

(IV)

wherein $R^1$ and $R^2$ independently are hydrocarbyl groups having at least 6 carbon atoms, and $R^3$ and $R^4$ independently are hydrocarbyl groups having at least 8 carbon atoms. Preferably $R^1$, $R^2$, $R^3$ and $R^4$ independently are straight chain alkyl groups. Even more preferably $R^1$ and $R^2$ independently have at least 7 or 8 carbon atoms and at most 20, 15 or 12 carbon atoms and/or $R^3$ and $R^4$ independently have at least 9 or 10 carbon atoms and at most 25, 20 or 15 carbon atoms. According to a preferred embodiment the dihydrocarbyl tin dicarboxylate is dioctyl tin dilaurate (DOTL).

Further silanol condensation catalysts which may be used with the present polymer compositions are described in WO2011/160964 and EP11178997.0 (EP 2 562 768).

The preferred amount of silanol condensation catalyst is from 0.0001 to 6 wt %, more preferably 0.001 to 2 weight % and most preferably 0.02 to 0.5 wt % of the total polymer composition. The effective amount of catalyst depends on the molecular weight of the catalyst used. Thus, a smaller amount is required of a catalyst having a low molecular weight than of a catalyst having a high molecular weight.

The silanol condensation catalyst usually is added to the polymer composition by compounding the polymer composition with a so-called master batch, in which the catalyst and optionally further additives are contained in a polymer, e.g. a polyolefin matrix in concentrated form.

The matrix polymer is preferably a polyolefin, more preferably a polyethylene, which may be a homo- or copolymer of ethylene, e.g. low density polyethylene, or polyethylene-methyl-, -ethyl, or -butyl-acrylate copolymer containing 1 to 50 wt % of the acrylate, and mixtures thereof.

In the master batch the compounds to be added to the polymer composition are contained in concentrated form, i.e. in a much higher amount than in the final composition. The master batch preferably comprises the silanol condensation catalyst in an amount of from 0.3 to 15 wt %, more preferably from 0.7 to 10 wt %. Furthermore, preferably the master batch also contains some or all of the additives, for example a stabilizer.

The master batch preferably is compounded with the polymer composition in an amount of from 1 to 10 wt %, more preferably from 2 to 8 wt % of the total composition. Compounding may be performed by any known compounding process, including extruding the final product with a screw extruder or a kneader.

The flame retardant compositions according to the present invention may be used in many and diverse applications and products.

The compositions can for example be moulded, extruded or otherwise formed into mouldings, sheets, webbing and fibres. As already mentioned, a particularly important use of the flame retardant compositions according to the present invention is for the manufacture of wire, cables and/or electrical devices. Cables may be communication cables or more preferably electrical or power cables. The compositions can be extruded about a wire or cable to form an insulating or jacketing layer or can be used as bedding compounds. According to a preferred embodiment the cable is a low voltage cable, preferably below 1000 V.

According to a particularly preferred embodiment the cable is a photovoltaic cable and UL44: American utility industrial and commercial building cable Advantageously the cable fulfills the UL44 and TÜV 2Pfg 1169/08.2007 standards.

Usually, the cable is produced by co-extrusion of the different layers onto the conducting core. Then, crosslinking is performed by moisture curing, wherein the silane groups are hydrolyzed under the influence of water or steam. Moisture curing is preferably performed in a sauna or water bath at temperatures of 70 to 100° C. or at ambient conditions.

The compositions can be extruded about a wire or cable to form an insulating or jacketing layer or can be used as bedding compounds. The polymer compositions are then preferably crosslinked.

The insulation layer of the low voltage power cable preferably has a thickness of 0.4 mm to 3.0 mm, preferably 2 mm or lower, depending on the application.

Preferably, the insulation is directly coated onto the electric conductor.

Test Methods

Unless otherwise stated in the description or claims, the following methods were used to measure the properties defined generally above and in the claims and in the examples below. The samples were prepared according to given standards, unless otherwise stated.

(a) Melt Flow Rate

The melt flow rate (MFR) is determined according to ISO 1133. The MFR is measured with a load of 21.6 Kg at 190° C. and/or with a load of 2.16 Kg at 130° C.

(b) Comonomer Content

Polar Comonomer Content (wt % and mol %)

Comonomer content (wt %) of the polar comonomer is determined in a known manner, based on Fourier transform infrared spectroscopy (FTIR) determination, calibrated with 13C-NMR as described in Haslam J, Willis H A, Squirrel D C. Identification and analysis of plastics, 2nd ed. London Iliffe books; 1972. The FTIR instrument used is a Perkin Elmer 2000, 2 scann, resolution 4 $cm^{-1}$.

For the determination of the comonomers, films with thickness 0.1 mm are prepared. The peak for the used comonomers are compared to the peak of polyethylene (e.g. the peak for butyl acrylate at 3450 $cm^{-1}$ are compared to the peak of polyethylene at 2020 $cm^{-1}$). The weight % is converted to mol % by calculation based on the total moles of polymerisable monomers.

Butyl Acrylate Content

Comonomer content (wt %) is determined in a known manner based on Fourier transform infrared spectroscopy (FTIR) determination calibrated with 13C-NMR. The peak for the comonomer is compared to the peak of polyethylene (e.g. the peak for butyl acrylate at 3450 $cm^{-1}$ is compared to the peak of polyethylene at 2020 $cm^{-1}$ and the peak for silane at 945 $cm^{-1}$ is compared to the peak of polyethylene at 2665 $cm^{-1}$. The calibration with 13C-NMR is effected in a conventional manner which is well documented in the literature.

The Content of Hydrolysable Silane Group(s)

The amount of hydrolysable silane group(s) $(Si(Y)_{3-q})$ is determined using X-ray fluorescence analysis (XRF):

The pellet sample is pressed to a 3 mm thick plaque (150° C. for 2 minutes, under pressure of 5 bar and cooled to room temperature). Si-atom content is analysed by wavelength dispersive XRF (AXS S4 Pioneer Sequential X-ray Spectrometer supplied by Bruker).

Generally, in the XRF-method, the sample is irradiated by electromagnetic waves with wavelengths 0.01-10 nm. The elements present in the sample will then emit fluorescent X-ray radiation with discrete energies that are characteristic for each element. By measuring the intensities of the emitted energies, quantitative analysis may be performed. The quantitative methods are calibrated with compounds with known concentrations of the element of interest_e.g. prepared in a Brabender compounder.

The XRF results show the total content (wt %) of Si and are then calculated and expressed herein as mol content of hydrolysable silane group(s) $(Si(Y)_{3-q})$/kg polymer according to the following formula:

$$Wsilane/Msilane/(Wsilane/Msilane+Wetylene/Methylene+Wcomonomer\text{-}1/Mcomonomer\text{-}1+Wcomonomer\text{-}n/Mcomonomer\text{-}n)$$

in which;

Wsilane=weight in gram of the hydrolysable silane group(s) $(Si(Y)_{3-q})$/kg polymer (a)

Msilane=molecular weight the hydrolysable silane group(s) $(Si(Y)_{3-q}$

Wethylene=weight in gram of ethylene/kg polymer (a)

Methylene=molecular weight of ethylene

Wcomonomer-1=weight in gram of comonomer-1/kg polymer (a) if present

Mcomonomer-1=molecular weight of comonomer-1 if present

Wcomonomer-n=weight in gram of comonomer-n/kg polymer (a) if present

Mcomonomer-n=molecular weight of comonomer-1 if present.

(c) 0-45 Degrees Variable Angle Test

This test, which gives an indication of the flame retardancy of an extruded polymer layer is a modification of vertical fire testing American methods VW-1(UL44). The present method follows the same specifications as VW-1 UL1581. Specific modifications departing from the specifications of VW-1 UL1581 are the followings.

The cable used is a 14 AWG conductor size using (2.08 mm²) 0.76 mm insulation. The cable sample is a 1 meter cable which is placed in a 45 deg shape. The cable is supported by and axial and vertical metallic sticks with the dimensions of x=24 cm and y=85 cm placed at 30 cm above ground. The cable is ignited in the low vertical part of the cable following VW-1 specifications, except the inclinations.

Once the cable is ignited, the flame runs through the cable; after, it automatically self-extinguishes. Then the last angle point where the fire has self extinguished is reported. If the cable is fully burnt all the way, the result automatically reported is 45 deg. Experiment ends when the fire has extinguished.

The final angle result is an average of 3 constants results (±3 deg) for identical cables.

This method allows ruling out flame retardant materials which do not pass VW-1 UL1581 vertical tests and pass UL1581 horizontal tests.

(d) Dripping Test

This method is intended to determine how different formulations drops, when they burn.

A metal grid with a size of 8 meshes and diameter of 150 mm is used.

Each polymer composition test plate is pressed into 3.0 mm thickness and cut to an area of 65×65 mm.

Before testing, the sample is conditioned at 23° C. for at least 16 hours at 50% relative humidity. The test is then carried out in a fume cupboard. The temperature in the fume cupboard shall be (23±10)° C.

Calibration of a flow-meter is performed when changing the gas bottle. The recorder is calibrated and the flow on the flow-meter is set to Butane: 650+−30 ml/min (23° C., 100 kPa). The plate is placed in the middle of a net.

A burner is lighted with a stable flame of approximately 130 mm with an inner blue flame of approximately 50 mm. The burner is placed at a 45 degree angle inclined towards the centre of the sample and that the tip of the inner blue flame hits the centre of the surface of the test object. The burner is kept in this position during the entire text execution. The test time varies greatly depending on the flammability of the material. When the sample is stops burning the burner is removed. At least three tests per sample are performed.

The drops are collected in a water bath at the bottom. The water is dried away and the drops are weighted. The weight of the dried droplet remains is divided by the original mass (m/m) and calculated as weight % of the original mass. The test is a comparable test and can divide to comparable materials.

(e) Crushing Resistance Test

The crushing resistance test serves to determine the ability of a cable to resist damage from radial compression, such as might be encountered in service, like a stone. The method is applicable to low voltage cables in the range 14 to 2 AWG (1.64 to 6.54 mm in diameter). The test is made according to UL 1581:2008, Crushing-Resistance Test of XHHW and XHHW-2.

The cable sample is cut to a length of 2.55 m. 10 measuring points with 230 mm intervals starting from one end are marked on the cable.

The cable is placed between 2 metal plates, which are closed with a rate of 1 mm/min. When the plates penetrate the cable a closed circuit is made with the conductors and the plates. The load is recorded. The measurements are performed 10 times along the cable and the average calculated.

(f) Horizontal Flame Test

This method determines the resistance to flame spread of simple insulated copper wires in a horizontal position. This method is based on UL1581 FT2 Flame test .

Each cable is ignited with a Bunsen burner, which is removed after 30 sec. The length of the burned cable shall be less than 10 cm to pass the test.

(g) Surface Analysis

The cable surface is visually examined and classified in four groups.

Very smooth surface: no lumps are observed on the cable surface;

smooth surface: few lumps<0.2 mm are observed on the cable surface;

rough surface: lots of lumps<0.2 mm and some lumps>0.2 mm are observed on the cable surface;

very rough surface: lots of lumps>0.2 mm are observed on the cable surface.

EXAMPLES

The present invention will now be described in more detail by reference to the following inventive examples and comparative examples.

Inventive Examples 1 to 7

The polymer compositions of the inventive examples are summarized in Table 1.

A terpolymer of ethylene/butyl acrylate/vinyltrimethoxysilane is used. The terpolymer has and $MFR_{2.16 Kg\ 190°\ C.}$ of about 0.80 g/10 min. The butyl acrylate content in the terpolymer is 8.0 wt %. The vinyltrimethoxysilane content is 2.0 wt %.

The terpolymer is produced in a tubular front feed with a pressure of 235 Mpa and a peak temperature of 260° C.

The $CaCO_3$ used in the inventive examples 1 to 7 is micronized and treated calcium carbonate sold under the trade name Microcarb® 95T. It contains 98.96 wt % of $CaCO_3$ and 0.59 wt % of $MgCO_3$. Other minor components are present in the carbonate. 94 wt % of the carbonate particles have a diameter below 2 µm according to the product datasheet.

The silicon gum (MB) used in the inventive examples 1 to 7 is sold under the trade name FR4897. This is a master batch with 40 wt % of silicone rubber.

Hexadecyl trimethoxy silane (HDTMS) is added to the compositions, as scorch retarder.

As antioxidants, Irganox 1010 and Irganox1024 are used.

The polymer compositions are prepared by mixing together the terpolymer, the silicone gum, the filler, the scorch retarder, the stabilizer and the antioxidants using a Buss mixer at a temperature in the range of 128-139° C.

The polymer compositions are then pelletized.

The dioctyl tin dilaurate (DOTL MB) silanol condensation catalyst is added as a master batch. The DOTL MB comprises 0.5 wt % of DOTL and 1 wt % of zinc stearate.

The compositions are then cable extruded on to a 2.1 $mm^2$ copper conductor. Then, crosslinking is performed in a water bath at temperatures of 90° C. for 24 hours. The cable samples are placed for degassing in a ordinary oven set up at 80° C. for 24 h. Then the samples are placed in a constant room set up at 24° C. and 50% humidity for 24 h. Then samples of desired length are cut out.

The results of the tests performed on the crosslinked cables are reported on in Table 4 and compared to the results obtained for the reference examples. All the inventive examples feature superior flame retardancy and mechanical properties with respect to the reference ones.

The composition of examples 5, 6 and 7 after extrusion are tested, then crosslinked and further tested. Table 3 shows the result of the dripping test for example 5, 6 and 7 before and after crosslinking. The dripping is measured on plaques that are made according to the test method. The crosslinked plaques has 5 wt % of DOTL MB added. Then, crosslinking is performed in a water bath at temperatures of 90° C. for 24 hours. Samples are placed for degassing in an ordinary oven set up at 80° C. for 24 h. Then, samples are placed in a constant room set up at 24° C. and 50% humidity for 24 h The results clearly show that crosslinking significantly decreases dripping.

Reference Examples 1 to 5

The polymer compositions of the reference examples are summarized in Table 2. In all the reference examples the same metal filler, antioxidants and stabilized as in the inventive examples are used.

The composition of Reference 1 contains a copolymer of ethylene/butyl acrylate (EBA1), PE VTMS copolymer and the silicon gum MB as in the compositions of the inventive examples.

The composition of Reference 2 contains a copolymer of ethylene/butyl acrylate (EBA2), PE VTMS copolymer and the silicon gum MB as in the compositions of inventive examples.

The composition of Reference 3 contains a copolymer of ethylene/butyl acrylate (EBA1) and the silicon gum in the compositions of inventive examples.

The EBA1 is an ethylene with 8 wt % of butylacrylate, $MFR_2$ of 0.35 g/10 min. The EBA is produced in a tubular front feed with a pressure of 230 MPa and a peak temperature of 300° C.

The EBA2 is an ethylene with 18 wt % of butylacrylate, $MFR_2$ of 1 g/10 min. The EBA is produced in a tubular front feed with a pressure of 235 Mpa and a peak temperature of 300° C.

The PE VTMS copolymer is a ethylene copolymer with 1.35 wt % of vinyltrimethoxysilane, having $MFR_2$ of 0.9 g/10 min. The PE VTMS copolymer is a tubular front feed with a pressure of 235 MPa and a peak of 260° C.

The composition of Reference 4 contains a terpolymer identical to the one used in the compositions of the inventive examples. However the composition does not include any silicon fluid MB.

The composition of Reference 5 contains a terpolymer identical to the one used in the compositions of the inventive examples. However the composition does not include any scorch retarder.

The polymer compositions are prepared by mixing together the components as described above. The polymer compositions are then pelletized and DOTL MB silanol condensation catalyst is added to the compositions.

The compositions are then extruded on to a 2.1 $mm^2$ (14 AWG) copper conductor. Minicable line Axon 24D, 20 mm screw diameter extruder at a line speed of 5 meter/minute is used by applying the following conditions: conductor temperature: 110° C.; cooling bath temperature: 10° C.; wire Guide: 1.48 mm; die: 3.15 mm; temperature profile: 130, 140, 150, 150° C.

Then, crosslinking is performed in a water bath at the temperature of 90° C. for 24 hours. The cable is then cooled and samples of desired length are cut out.

The results of the tests performed on cables are reported in Table 4 and 5 and compared to the results obtained for the inventive examples. All the samples are crosslinked with DOTL MB. The reference examples feature inferior flame retardancy and/or mechanical properties with respect to the inventive ones.

Table 3 shows the effect of crosslinking on the composition of the invention. Samples Ex5a, Ex6a, Ex7a and Ref3a are not crosslinked, whereas examples Ex5, Ex6, Ex7 are crosslinked and have 5 wt % of crosslinking DOTL MB.

TABLE 1

| Component wt % total composition | Ex1 | Ex2 | Ex3 | Ex4 | Ex5 | Ex6 | Ex7 |
|---|---|---|---|---|---|---|---|
| Terpolymer | 61.45 | 60.45 | 57.45 | 54.95 | 48.9 | 40.95 | 47.45 |
| Silicon gum MB | 1 | 2 | 5 | 7.5 | 12.5 | 12.5 | 15 |
| $CaCO_3$ | 36 | 36 | 36 | 36 | 36 | 45 | 36 |
| HDTMS | 1 | 1 | 1 | 1 | 1 | 1 | 1 |
| Antioxidant 1 | 0.3 | 0.3 | 0.3 | 0.3 | 0.3 | 0.3 | 0.3 |
| Antioxidant 2 | 0.25 | 0.25 | 0.25 | 0.25 | 0.25 | 0.25 | 0.25 |

TABLE 2

| Component wt % total composition | Ref1 | Ref 2 | Ref3 | Ref4 | Ref5 |
|---|---|---|---|---|---|
| PE-VTMS copolymer | 30.85 | 30.85 | | | |
| EBA 1 | 30.6 | | 61.45 | | |
| EBA 2 | | 30.6 | | | |
| Terpolymer | | | | 62.45 | 56.45 |
| Silicon Gum MB | 1 | 1 | 7 | 0 | 7 |
| HDTMS | 1 | 1 | 1 | 1 | 0 |
| CaCO$_3$ | 36 | 36 | 30 | 36 | 36 |
| Antioxidant 1 | 0.3 | 0.3 | 0.3 | 0.3 | 0.3 |
| Antioxidant 2 | 0.25 | 0.25 | 0.25 | 0.25 | 0.25 |

TABLE 3

| Test | Ex5a | Ex5 | Ex6a | Ex6 | Ex7a | Ex7 | Ref 3a |
|---|---|---|---|---|---|---|---|
| Dripping (%) | 8.9 | 0 | 4.8 | 0.1 | 6.3 | 0.2 | 64 |

TABLE 4

| Test | Ex1 | Ex2 | Ex3 | Ex4 | Ref1 | Ref 2 | Ref3 | Ref4 |
|---|---|---|---|---|---|---|---|---|
| Horizontal flame test | pass | pass | pass | pass | fail | fail | fail | fail |
| Variable angle 0 deg (drips) | No 0-2 | No 0-2 | No 0-2 | No 0-2 | High 40-80 | High 40-80 | v. high >80 | High 40-80 |
| Crushing Resistance (N) | 5546 | 5287 | 4623 | 3612 | 4223 | 6251 | 4862 | 5925 |
| Variable angle 0-45 (deg) | 35 | 32 | 34 | 32 | 45 | 45 | 45 | 45 |

TABLE 5

| Test | Ex4 | Ref5 |
|---|---|---|
| Horizontal flame test | pass | pass |
| Variable angle 0 deg (drips) | No 0-2 | No 0-2 |
| Crushing Resistance (N) | 3501 | 3623 |
| Variable angle 0-45 (deg) | 33 | 32 |
| Surface smoothness | Very smooth | Rough |

The invention claimed is:

1. A flame retardant polymer composition comprising:
   (A) a crosslinkable terpolymer comprising ethylene monomer units, a silane group containing comonomer units and comonomer units comprising a polar group;
   (B) a metal carbonate filler;
   (C) a silicone fluid or gum; and
   (D) a scorch retarder,
   wherein the content of the comonomer units comprising a polar group is between 2 and 25 wt % of the terpolymer and the content of the silane group containing comonomer units is between 0.2 and 4 wt % of the terpolymer.

2. The polymer composition according to claim 1 wherein the polar groups are selected from the groups consisting of acrylic acids, methacrylic acids, acrylates, methacrylates, and vinyl ester.

3. The polymer composition according to claim 1 wherein the terpolymer is present in an amount of 38 to 65 wt % of the total polymer composition.

4. The polymer composition according to claim 1 wherein the terpolymer has a MFR$_{2.16, 190° C.}$ between 0.1 to 10 g/10 min.

5. The polymer composition according to claim 1 wherein the metal carbonate filler is present in an amount between 10 to 62 wt % of the total polymer composition.

6. The polymer composition according to claim 1 wherein the silicone fluid or gum is present in an amount between 0.1 to 20 wt % of the total polymer composition.

7. The polymer composition according to claim 1 comprising:
   (A) an ethylene/ethyl-acrylate or butyl-acrylate/vinyltrimethoxysilane terpolymer;
   (B) a silicon fluid or gum;
   (C) calcium carbonate;
   (D) a scorch retarder,
   and wherein (A), (B), (C) and (D) together amount to at least 97 wt % of the total polymer composition.

8. A cable having a layer comprising the polymer composition of claim 1.

9. The cable of claim 8 wherein the polymer composition is crosslinked.

10. The cable according to claim 8 which is a photovoltaic cable.

11. The cable according to claim 9 which is a photovoltaic cable.

12. A photovoltaic solar module having a layer comprising the polymer composition of claim 1.

* * * * *